United States Patent
Frost et al.

(10) Patent No.: US 10,048,320 B2
(45) Date of Patent: Aug. 14, 2018

(54) SYSTEMS AND METHODS FOR ESTIMATING BATTERY SYSTEM POWER CAPABILITY

(71) Applicant: GM GLOBAL TECHNOLOGY OPERATIONS LLC, Detroit, MI (US)

(72) Inventors: Patrick Frost, Berkley, MI (US); Brian J. Koch, Berkley, MI (US); Patricia M. Laskowsky, Ann Arbor, MI (US); Ashley McAllister, Macomb, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 332 days.

(21) Appl. No.: 14/738,661

(22) Filed: Jun. 12, 2015

(65) Prior Publication Data

US 2016/0363629 A1    Dec. 15, 2016

(51) Int. Cl.
*G01R 31/36* (2006.01)
*B60W 10/08* (2006.01)
*B60W 10/26* (2006.01)
*B60W 30/188* (2012.01)

(52) U.S. Cl.
CPC ......... *G01R 31/3651* (2013.01); *B60W 10/08* (2013.01); *B60W 10/26* (2013.01); *B60W 30/188* (2013.01); *B60W 2510/244* (2013.01); *G01R 31/3693* (2013.01); *Y02T 10/7258* (2013.01)

(58) Field of Classification Search
CPC .............................. B60W 10/08; B60W 10/26
USPC ........................................................ 702/63
See application file for complete search history.

(56) References Cited

U.S. PATENT DOCUMENTS

| 7,646,166 | B2* | 1/2010 | Koch | B60L 11/1851 320/104 |
| 2013/0043219 | A1* | 2/2013 | Peters | B23K 35/0261 219/72 |
| 2014/0277879 | A1* | 9/2014 | Sheidler | A01D 41/12 701/22 |
| 2016/0001670 | A1* | 1/2016 | Lee | B60L 11/1809 320/134 |

* cited by examiner

*Primary Examiner* — Anthan Tran
(74) *Attorney, Agent, or Firm* — Phillips Ryther & Winchester; Jared L. Cherry

(57) ABSTRACT

System and methods for estimating a future power capability of a battery system included in a vehicle are presented. In some embodiments, a method for estimating a future power capability of a battery system may include determining an initial battery voltage when the battery operates at a current limit and estimating a future battery current at a first time when the battery operates at the associated voltage limit based on the initial battery current. A future battery voltage at the first time when the battery operates at the associated current limit may be determined based on the initial battery voltage. An estimated voltage-limited power capability of the battery at the first time may be determined based on the future battery current and an estimated current-limited power capability of the battery at the first time may be determined based on the future battery voltage.

11 Claims, 5 Drawing Sheets

SYSTEMS AND METHODS FOR ESTIMATING BATTERY SYSTEM POWER CAPABILITY

TECHNICAL FIELD

This disclosure relates to systems and methods for estimating power capability of a battery system. More specifically, but not exclusively, the systems and methods disclosed herein relate to estimating power capability of a battery system using a forward-iteration method.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("ESS") included in a vehicle may be used to power electric drivetrain components of the vehicle.

Information regarding power capability of a battery system may be utilized in a variety of applications including modeling battery system performance and/or in connection with battery system control and/or management decisions. The power capability of a battery system may provide information relating to an amount of electric current that may be drawn from a battery system at a particular point in time. A battery and/or vehicle control system may utilize information relating to a future estimated power capability of a battery system in connection with battery and/or vehicle management and control decisions. Conventional methods for estimating future battery system power capability may not be particularly accurate, however, thereby reducing the value of such information in connection with battery and/or vehicle modeling, management, and/or control activities.

SUMMARY

Systems and methods disclosed herein may provide for improved estimation of future battery system power capability. In certain embodiments, relatively accurate estimates of future power capability of a battery system may be utilized in a variety of battery and vehicle management and/or control decisions. For example, a vehicle control system may utilize estimated future battery system power capability information in connection with determining available vehicle drivetrain performance levels (e.g., available acceleration levels, vehicle speed levels, available drivetrain torque, etc.)

In some embodiments, future battery system power capability may be estimated based, at least in part, on a present state of the battery system. Consistent with embodiments disclosed herein, a forward-iterative method for estimating battery system power capability may project a state of a battery system forward to determine a predicted battery current when the battery system operates at a voltage limit and a predicted battery voltage when the battery system operates at its current limit. The method may then iterate forward, using the results calculated for a prior time step in connection with the projected next time step until a desired power prediction window is completed. In some embodiments, the predicted currents and/or voltages may be used to determine into an estimated power capability at the various time steps.

In some embodiments, a method for estimating a power capability of a battery system included in a vehicle may include determining an initial battery current when the battery system operates at an associated voltage limit. An initial battery voltage when the battery system operates at an associated current limit may be determined.

A first future battery current at a first iteration interval time when the battery system operates at the associated voltage limit based on the initial battery current may be estimated. Similarly, a first future battery voltage at the first iteration interval time when the battery system operates at the associated current limit based on the initial battery voltage may be estimated. In some embodiments, estimating the first future battery current and estimating the first future battery voltage may include determining parameters associated with a model of the battery system (e.g., an equivalent circuit model or the like) at the first iteration interval time.

Based on the first future battery current, a first estimated voltage-limited power capability of the battery system at the first iteration interval time may be determined. Similarly, based on the first future battery voltage, a first estimated current-limited power capability of the battery system at the first iteration interval time may be determined. In certain embodiments, the first estimated voltage-limited power capability and the first estimated current-limited power capability may be communicated to a control system associated with the battery system. In further embodiments, a control action in a vehicle associated with the battery system may be implemented based on the estimated power capability of the battery system. Exemplary control actions may include, without limitation, changing a maximum drivetrain acceleration allowed by a vehicle control system, changing a maximum drivetrain speed allowed by a vehicle control system, changing a maximum drivetrain torque allowed by a vehicle control system, and/or the like.

In certain embodiments, a second future battery current at a second iteration interval time following the first iteration interval time when the battery system operates at the associated voltage limit based on the first future battery current may be estimated. A second future battery voltage at the second iteration interval time when the battery system operates at the associated current limit based on the first future battery voltage may further be estimated. Based on the second future battery current, a second estimated voltage-limited power capability of the battery system at the second iteration interval time may be determined. A second estimated current-limited power capability of the battery system at the second iteration interval time may be further determined based on the second future battery voltage.

In certain embodiments, the aforementioned method may be performed by a BSE system and/or any other computing system and/or implemented using a non-transitory computer-readable medium storing associated executable instructions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Figure 1:
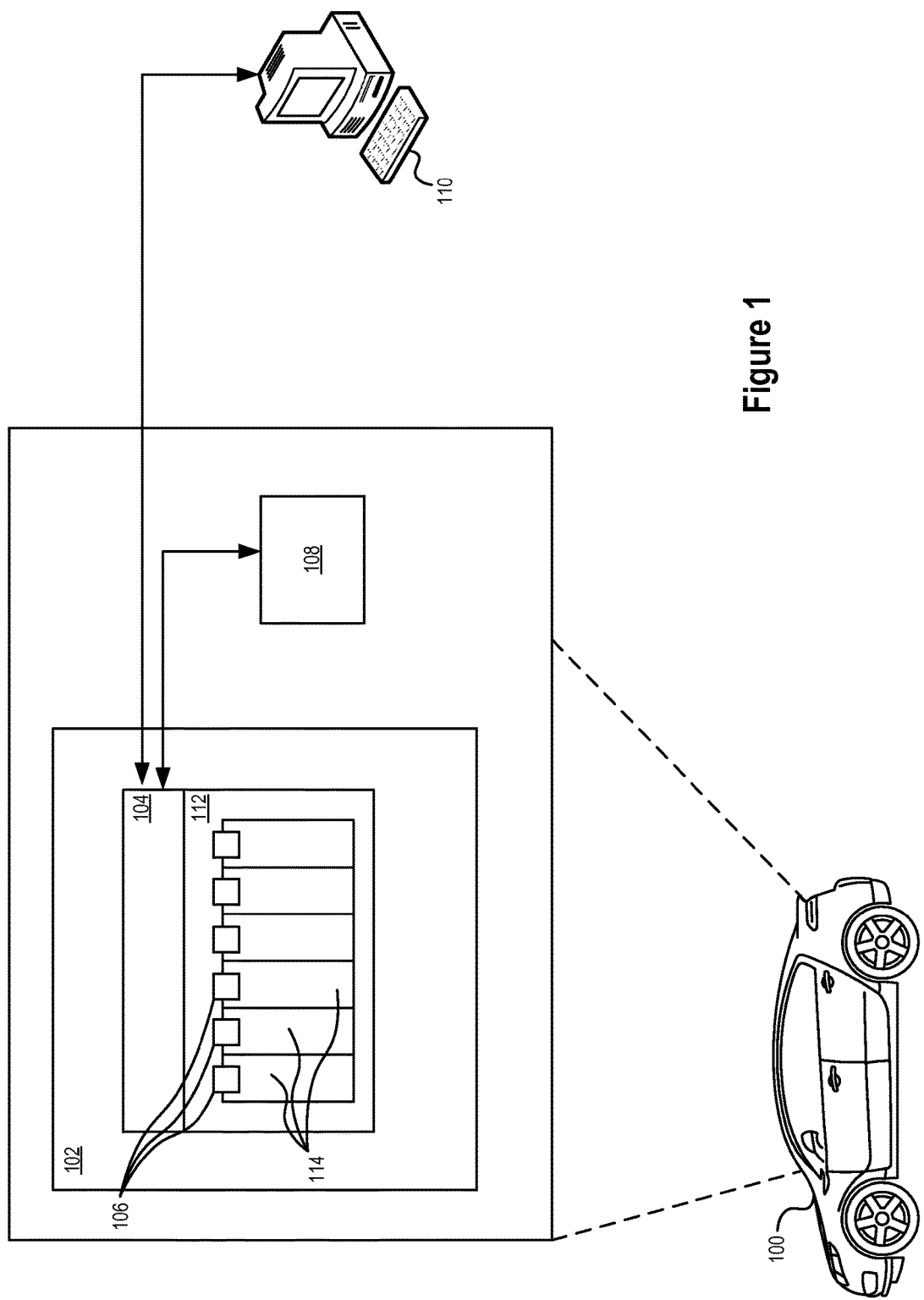
FIG. 1 illustrates an exemplary system for estimating a capability of a battery system included in a vehicle consistent with embodiments disclosed herein.

FIG. 1 illustrates an exemplary system for estimating a power capability of a battery system 102 consistent with embodiments disclosed herein. In certain embodiments, the battery system 102 may be included in a vehicle 100. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. The vehicle 100 may include a battery system 102 that, in certain embodiments, may be an HV battery system. The HV battery system may be used to power electric drivetrain components (e.g., as in an electric, hybrid, or FC power system).

In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like. Although illustrated in connection with a battery system 102 included in a vehicle 100, it will be appreciated that embodiments of the disclosed systems and methods may be implemented in connection with a wide variety of battery systems including in connection with batteries systems that are not included in a vehicle.

The battery system 102 may include a battery control system 104. The battery control system 104 may be configured to monitor and control certain operations of the battery system 102. For example, the battery control system 104 may be configured to monitor and control charging and discharging operations of the battery system 102. In certain embodiments, the battery control system 104 may be utilized in connection with the methods disclosed herein to estimate, model, and/or otherwise determine a power capability of the battery system (e.g., a future power capability of the battery system and/or the like). In certain embodiments, the battery control system 104 may be communicatively coupled with one or more sensors 106 (e.g., voltage sensors, current sensors, and/or the like, etc.) and/or other systems (e.g., internal computer system 108, external computer system 110, etc.) configured to enable the battery control system 104 to monitor and control operations of the battery system 102 and/or perform certain methods disclosed herein. For example, sensors 106 may provide battery control system 104 with information used to estimate a SOC, estimate an impedance, measure a current, measure voltage of a battery pack 112 and/or constituent battery cells 114, and/or any other information that may be utilized in connection with the disclosed embodiments.

The battery control system 104 may further be configured to provide information to and/or receive information from other systems (e.g., internal computer system 108) included in the vehicle 100 that, in some embodiments, may comprise BSE systems. For example, the battery control system 104 may be communicatively coupled with an internal vehicle computer system 108 and/or an external computer system 110 (e.g., via a wired and/or wireless telecommunications system or the like) configured to perform BSE methods consistent with the disclosed embodiments. In some embodiments, the internal vehicle computer system 108 and/or an external computer system 110 may be configured to estimate a power capability of a battery system 102 including, for example, a future estimated power capability of the battery system 102.

In certain embodiments, the battery control system 104 may be configured, at least in part, to provide information regarding the battery system 102 (e.g., information measured by sensors 106 and/or determined by control system 104 in response to one or more requests) to a user, testing personnel, service personnel, and/or the like of the vehicle 100, the vehicle computer system 108, and/or the external computer system 110. Such information may include, without limitation, battery SOC, state of energy ("SOE"), and/or state of health ("SOH") information, battery energy power capability and/or capacity information, battery operating time information, battery cycle information, battery operating temperature information, vehicle range information, and/or any other information regarding the battery system 102 that may be utilized in connection with determining battery system power capability information and/or information used in connection with battery system 102 and/or vehicle 100 management and/or control operations.

The battery system 102 may include one or more battery packs 112 suitably sized to provide electrical power to the vehicle 100. Each battery pack 112 may include one or more battery cells 114. The battery cells 114 may utilize any suitable battery technology or combination thereof. Suitable battery technologies may include, for example, lead-acid, nickel-metal hydride ("NiMH"), lithium-ion ("Li-Ion"), Li-Ion polymer, zinc-air, lithium-air, nickel-cadmium ("Ni-Cad"), valve-regulated lead-acid ("VRLA") including absorbed glass mat ("AGM"), nickel-zinc ("NiZn"), molten salt (e.g., a Na—NiCl$_2$ battery), and/or other suitable battery technologies. Each battery cell 114 may be associated with sensors 106 configured to measure one or more parameters (e.g., voltage, current, temperature, etc.) associated with each cell 114. Although FIG. 1 illustrates separate sensors 106 associated with each battery cell 114, in some embodiments a sensor configured to measure various electrical parameters associated with a plurality of cells 114 may also be utilized.

Information measured by sensors 106 may be provided to the battery control system 104 and/or one or more other systems (e.g., internal computer system 108 and/or external computer system 110). Using the information, the battery control system 104 and/or any other suitable system may coordinate the operation of battery system 102 (e.g., charging operations, discharging operations, balancing operations, etc.). The battery control system 104, internal computer system 108, external computer system 110, and/or any other suitable system implementing BSE methods may further utilize such information in connection with the disclosed embodiments to estimate a power capability of the battery system 102 as part of monitoring, control, characterization, and/or modeling activities.

Figure 2:
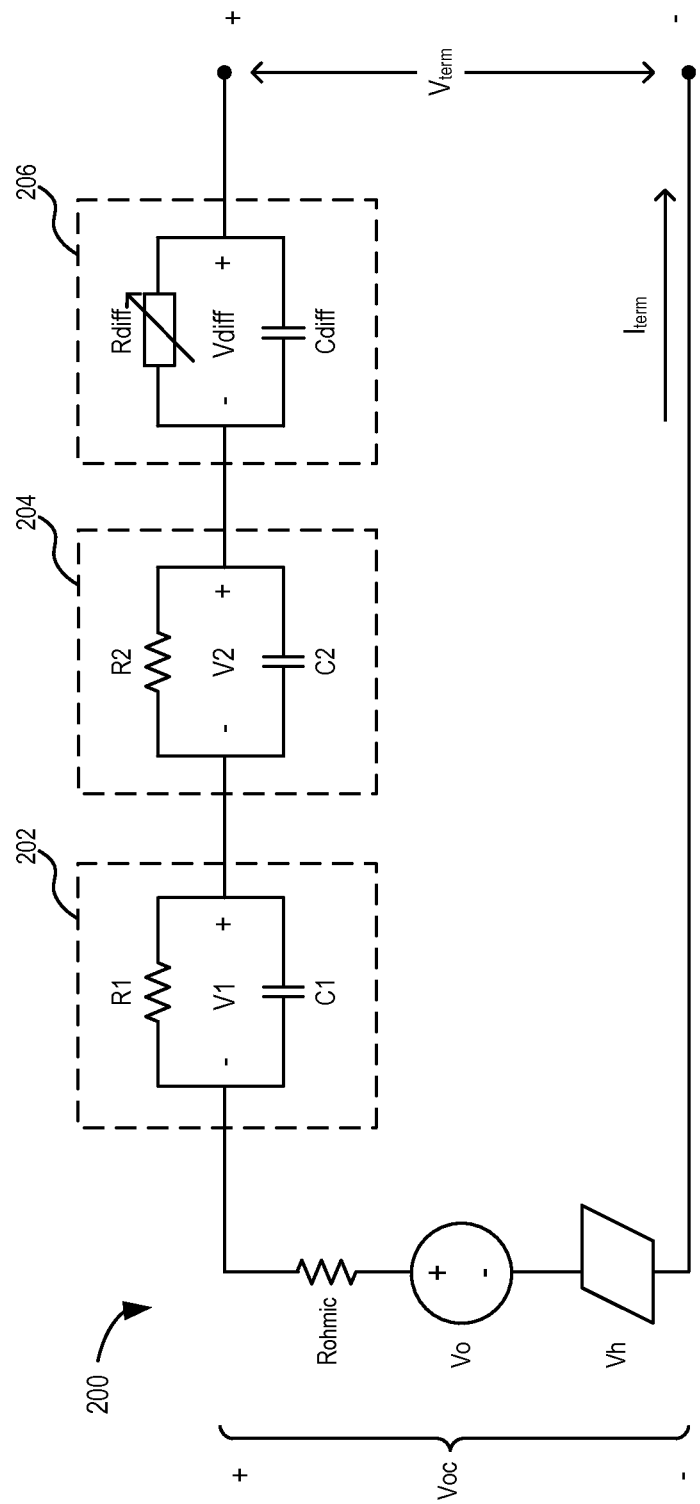
FIG. 2 illustrates an exemplary circuit model for modeling a battery system consistent with embodiments disclosed herein.

FIG. 2 illustrates an exemplary circuit model 200 for modeling a battery system consistent with embodiments disclosed herein. In certain embodiments, an equivalent circuit model ("ECM") 200 may be used in connection with modelling and/or otherwise approximating various responses and/or behaviors of a battery system and/or a constituent battery cell. For example, consistent with certain embodiments disclosed herein, an ECM 200 of a battery system and/or cell may be used in connection with estimating a future power capability of the battery system and/or cell.

In some embodiments, the ECM 200 may comprise an RC circuit model used to approximate certain behaviors and/or transient responses of an associated battery system and/or cell. As illustrated, the ECM 200 may comprise a plurality of parallel resistor-capacitor pairs 202-206 coupled in series (e.g., three resistor-capacitor pairs). The resistor-capacitor pairs 202-206 may be coupled in series with a series resistance $R_{ohmic}$, a battery voltage source $V_o$, and a hysteresis voltage source $V_h$. In certain embodiments, resistor-capacitor pair 206 may comprise a diffusion circuit element configured to model a diffusion voltage, $V_{diff}$, in the battery. In some embodiments, the resistor-capacitor pair 206 may comprise a diffusion capacitor, $C_{diff}$, coupled in parallel to a variable resistance, $R_{diff}$, having a resistance value that may be a function of a charge on the diffusion capacitor.

Various parameter values of the electrical components in the ECM 200 may be selected so as to approximate a behavior and/or transient response of an associated battery system and/or cell. In some embodiments, the various parameter values may be measured and/or selected using regression techniques. In certain embodiments, a voltage across the ECM 200, $V_{term}$, may be expressed according to:

$$V_{term}[k]=V_{oc}[k]+I_{term}[k]\cdot R_{ohmic}+V_1[k]+V_2[k]+V_{diff}[k] \quad \text{(Eq. 1)}$$

where $V_{term}$ is the voltage across the terminals of the battery system, $V_{oc}$ is the open circuit voltage ("OCV") of the battery system (e.g., which may be expressed as a sum of a battery voltage source $V_o$, and a hysteresis voltage source $V_h$), $I_{term}$ is the current at the terminals of the battery system, $R_{ohmic}$ is the ohmic resistance of the battery system, $V_1$ and $V_2$ are the double-layer voltage (e.g., a voltage drop induced by movement of ions through electrolyte in the battery system, and $V_{diff}$ is the diffusion voltage (e.g., the voltage drop induced by energy to transport ions from deep in the electrode substrate).

Consistent with embodiments disclosed herein, a forward-iterative method for estimating battery system power capability may project a state of a battery system forward to determine a predicted battery current when the battery system operates at a voltage limit and a predicted battery voltage when the battery system operates at its current limit. In certain embodiments, a current-limited power capability of the battery system, derived using Eq. 1, may be expressed according to:

$$P_{I=Ilim*}[k]=I_{lim}*[k]\cdot V_{I=Ilim*}[k] \quad \text{(Eq. 2)}$$

where $I_{lim}$ is the maximum current allowed for battery system operation and $V_{I=Ilim}$ is the predicted voltage when the battery is operating at the current limit.

Similarly, in some embodiments, a voltage-limited power capability of the battery system, derived using on Eq. 1, may be expressed according to:

$$P_{V=Vlim*}[k]=I_{V=vlim*}[k]\cdot V_{lim}*[k] \quad \text{(Eq. 3)}$$

where $V_{lim}$ is the minimum (e.g., discharge) or maximum (e.g., charge) voltage allowed for battery system operation $I_{V=Vlim}$ is the predicted current when the battery system is operating at the voltage limit.

Figure 3:
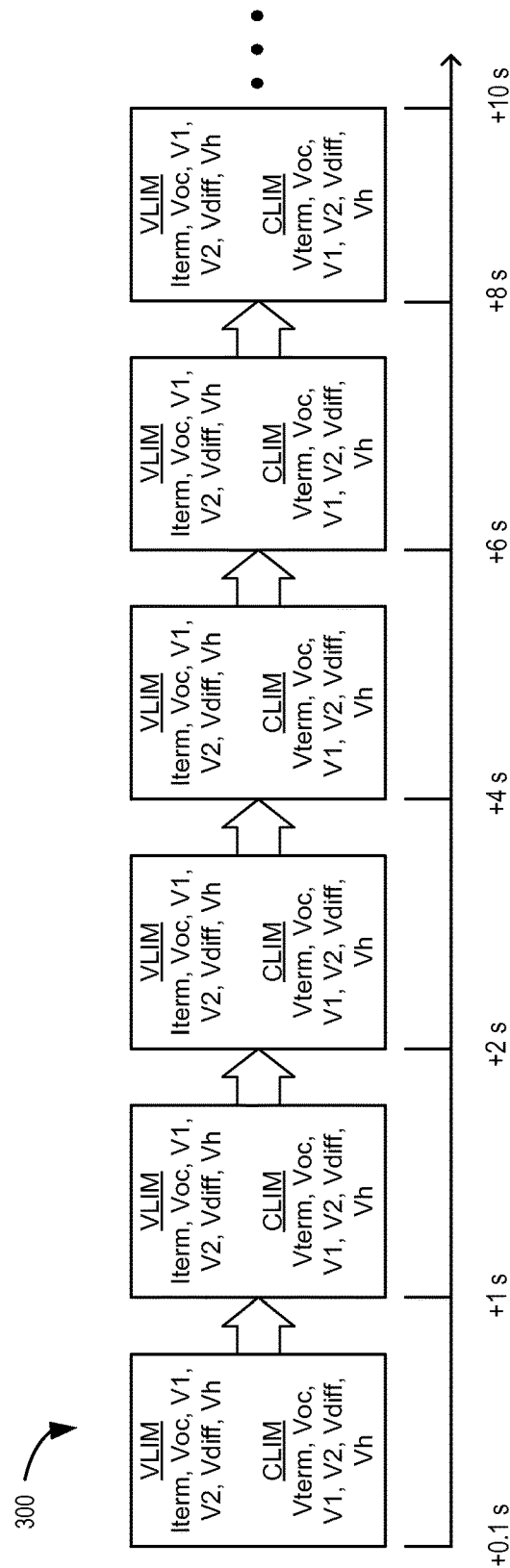
FIG. 3 illustrates a conceptual diagram of a forward-iterative method for estimating battery system power capability consistent with embodiments disclosed herein.

FIG. 3 illustrates a conceptual diagram 300 of a forward-iterative method for estimating battery system power capability consistent with embodiments disclosed herein. As discussed above, certain embodiments of the disclosed systems and methods may estimate a future and/or otherwise predicted estimated battery power capability based, at least in part, on a present state of the battery system.

As illustrated in diagram 300, embodiments of the disclosed forward-iterative method for estimating battery system power capability may project a state of a battery system forward (e.g. at 0.1 seconds from a present state, at 1 second from a present state, etc.) to determine a predicted battery current when the battery system operates at a voltage limit and a predicted battery voltage when the battery system operates at its current limit. At the projected forward interval, various parameters used in an ECM associated with the battery system may be selected and/or otherwise determined to approximate the behavior and/or transient response of the battery system at the projected time.

For example, in connection with determining a predicted battery current when the battery system operates at its voltage limit, ECM parameters including $I_{term}$, $V_{oc}$, V1, V2, $V_{diff}$, and $V_h$ may be determined to approximate the behavior and/or transient response of the battery system at a first projected time. Similarly, in connection with determining a predicted battery voltage when the battery system operates at its current limit, ECM parameters including $V_{term}$, $V_{oc}$, V1, V2, $V_{diff}$, and $V_h$ may be determined to approximate the behavior and/or transient response of the battery system at the first projected time. The predicted currents and/or voltages may be utilized to determine the estimated power capability of the battery system at the first projected time. As shown, the method may then iterate forward, using the results calculated from a prior time step in connection with the projected next time step until a desired power prediction window is completed.

Figure 4:
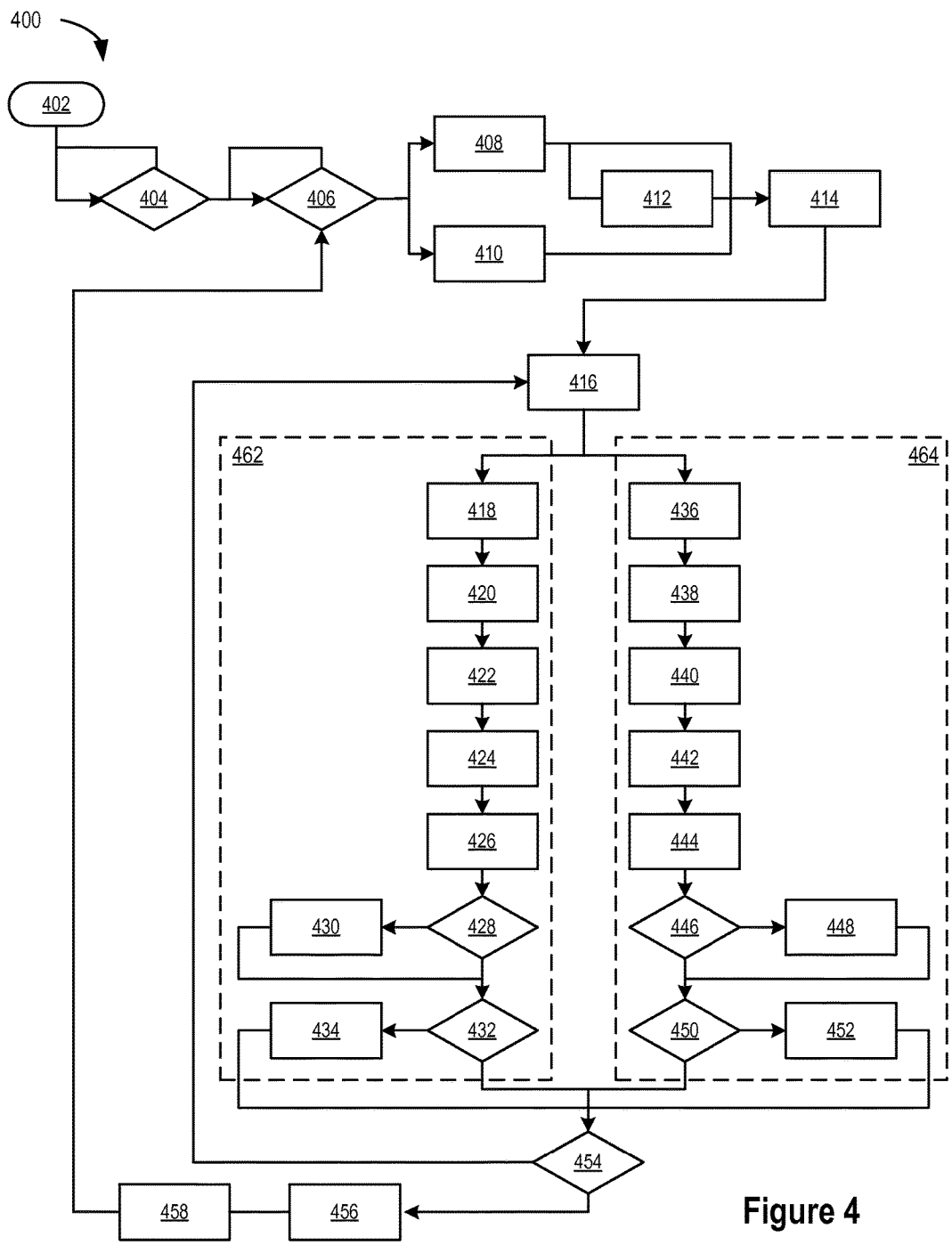
FIG. 4 illustrates a flow chart of an exemplary method for estimating a power capability of a battery system consistent with embodiments disclosed herein.

FIG. 4 illustrates a flow chart of an exemplary method 400 for estimating a power capability of a battery system consistent with embodiments disclosed herein. In certain embodiments, one or more of the illustrated elements of the method 400 may be performed by and/or to implement using a battery control system, an internal computer system, an external computer system, and/or any other system or combination of systems configured implemented BSE methods and/or, monitor, model, and/or otherwise characterize parameters of a battery system including an estimated power capability of the battery system.

At 402, the method 400 may initiate. At 404, a determination may be made whether a battery control system (e.g., a control system implementing certain BSE methods, a vehicle integration or interface control module ("VICM"), a battery management system ("BMS"), etc.) associated with the battery system is awake and/or otherwise in an active. If not, the method 400 may cycle until the control system is in an active or awake state. If the control system is in an active or awake state, the method may proceed to 406.

At 406, a determination may be made whether inputs used in connection with the method 400 are ready. In certain embodiments, the inputs may be ready when upstream algorithms related to method 400 that process sensor signals determine that sensed values are valid (e.g., any start-up delays or effects associated with sensors have passed). If not, the method 400 may cycle until the inputs are ready. If the inputs are ready, the method 400 may proceed to 408 and 410.

At 408, initial values of certain parameters included in an ECM associated with the battery system may be determined through a regression process. For example, in some embodiments, initial ECM parameters that may include, without limitation, an open circuit voltage ("OCV") $V_{oc}$), an ohmic resistance $R_{ohmic}$, and/or values associated with certain resistor-capacitor pairs in the ECM (e.g., $C_1$, $R_1$, $V_1$, $C_2$, $R_2$, and/or $V_2$) may be determined through a regression process. In some embodiments, voltage and/or current information may be used to regress individual circuit model parameters (e.g., using an extended Kalman filter and/or the like) based on equations associated with the circuit model.

At 410, certain parameters relating to a diffusion circuit element included in the ECM configured to model a diffusion voltage, $V_{diff}$, in the battery system may be calculated. For example, in some embodiments, a value of a diffusion capacitor, $C_{diff}$ and an associated a variable resistance, $R_{diff}$, which may have a resistance value that may be a function of a charge on the diffusion capacitor, may be calculated. In addition, a time constant associated with the diffusion circuit element, T, may be calculated. In some embodiments, the time constant may be calculated as a product of the diffusion capacitor value and the variable resistance value.

At 412, based on the values determined at 408, a SOC of the battery system may be determined. The various information determined and/or otherwise calculated at steps 408-412 may be passed to 414, where a current-dependence of resistance may be calculated. In some embodiments, $R_{ohmic}$ may be adjusted based on a relationship characterized via cell testing that relates instantaneous voltage drop to current pulse size, and the ratio of $R_{ohmic}$ at the current or voltage limit to $R_{ohmic}$ at the average current during operation Is use the regressed $R_{ohmic}$ In other embodiments, this may be accomplished via the Bulter-Volmer equation relating current density to resistivity in an electrochemical cell.

At 416, a forward iteration of the method 400 may be initiated. In some embodiments, the forward iteration may comprise steps 462 associated with determining a predicted battery current when the battery system operates at its voltage limit and steps 464 associated with determining a predicted battery voltage when the battery system operates at its current limit.

To determine predicted battery current when the battery system operates at its voltage limit, a predicted OCV of the battery system may be calculated at 418 using a current associated with the voltage limit determined using a previous iteration of the method (if any). An associated current to reach the voltage limit based on ECM parameters associated with the present iteration of the battery system may be determined at 420.

At 422, a predicted voltage across a first resistor-capacitor pair of the ECM, $V_1$, may be determined based on a current to reach the voltage limit associated with the present state of the battery system and/or a previous predicted voltage across the first resistor-capacitor pair associated with a prior iteration of the method 400. At 424, a predicted voltage across a second resistor-capacitor pair of the ECM, $V_2$, may be determined based on a current to reach the voltage limit associated with the present state of the battery system and/or a previous predicted voltage across the second resistor-capacitor pair associated with a prior iteration of the method 400.

A predicted diffusion voltage of the ECM, $V_{diff}$, may be determined at 426 based on the current to reach the voltage limit associated with the present state of the battery system and/or a previous predicted diffusion voltage associated with a prior iteration of the method 400.

At 428, it may be determined whether a time associated with the present iteration has reached a first iteration threshold (e.g., a short term iteration threshold associated with 2 seconds in the future from an initial present state or the like). If so, the method 400 may proceed to 430, where the current to reach the voltage limit determined at 420 may be output for use in connection with determining a future estimated power capability of the battery system at the future iteration time associated with the first iteration threshold.

At 432, it may be determined whether a time associated with the present iteration has reached a second iteration threshold (e.g., a long term iteration threshold associated with 10 seconds in the future from an initial present state). If so, the method 400 may proceed to 434, where the current to reach the voltage limit determined at 420 may be output for use in connection with determining a future estimated power capability of the battery system at the future iteration time associated with the second iteration threshold.

At 436, a predicted OCV of the battery system may be computed using the ECM and the current limit of the battery system. At 438, a predicted voltage across a first resistor-capacitor pair of the ECM, $V_1$, may be determined based on the current limit of the battery system and/or a previous predicted voltage across the first resistor-capacitor pair associated with a prior iteration of the method 400. At 440, a predicted voltage across a second resistor-capacitor pair of the ECM, $V_2$, may be determined based on the current limit of the battery system and/or a previous predicted voltage across the second resistor-capacitor pair associated with a prior iteration of the method 400. A predicted diffusion voltage of the ECM, $V_{diff}$, may be determined at 442 based on the current limit of the battery system and/or a previous predicted diffusion voltage associated with a prior iteration of the method 400.

Based on the information determined in steps 446-442 (e.g., OCV, $V_1$, $V_2$, $V_{diff}$ and a current limit), a predicted battery voltage when the battery system operates at its current limit for the present iteration may be determined at 444. At 446, it may be determined whether a time associated with the present iteration has reached a first iteration threshold (e.g., a short term iteration threshold associated with 2 seconds in the future from an initial present state or the like).

If so, the method 400 may proceed to 448, where the voltage determined at 444 may be output for use in connection with determining a future estimated power capability of the battery system at the future iteration time associated with the first iteration threshold.

At 450, it may be determined whether a time associated with the present iteration has reached a second iteration threshold (e.g., a long term iteration threshold associated with 10 seconds in the future from an initial present state). If so, the method 400 may proceed to 452, where the voltage determined at 444 may be output for use in connection with determining a future estimated power capability of the battery system at the future iteration time associated with the second iteration threshold.

A determination may be made at 454 regarding whether a third iteration threshold, which may be a maximum iteration threshold, has been reached. If not, the method 400 may return to 416 and a new iteration may be performed. Otherwise, the method 400 may proceed to 456.

At 456, a time to reach the predicted battery voltage when the battery system operates at its current limit may be determined. In some embodiments, the time may be calculated by comparing a predicted voltage of a present iteration to the voltage limit. At 458, an estimated and/or otherwise predicted power capability of the battery system for the various iteration thresholds (e.g., short term and/or long term thresholds) may be determined at 458 based on the current and/or voltage information output at steps 430, 434, 448 and 452 (e.g. using Eqs. 2-3 and/or any other suitable method).

In some embodiments, the method 400 may further comprise implementing a control action based on the estimated battery system power capability. For example, in some embodiments, an available drivetrain acceleration, vehicle top speed, and/or drivetrain torque may be adjusted by a vehicle control system based on the estimated available battery system power capability.

Figure 5:
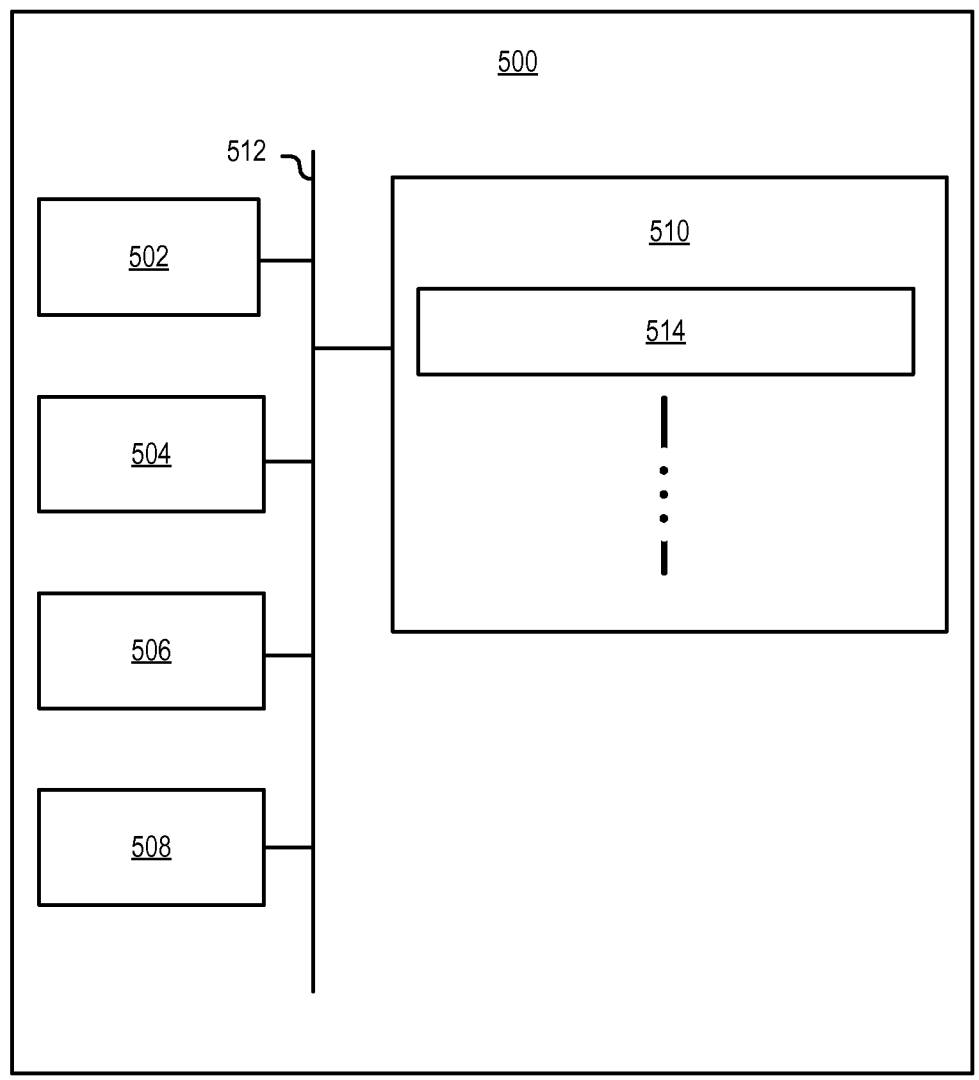
FIG. 5 illustrates an exemplary system for implementing certain embodiments of the systems and methods disclosed herein.

FIG. 5 illustrates an exemplary system 500 for implementing certain embodiments of the systems and methods disclosed herein. In certain embodiments, the computer system 500 may be a personal computer system, a server computer system, an on-board or internal vehicle computer, a battery control system, an external computer system, and/or any other type of system suitable for implementing the disclosed systems and methods. In further embodiments, the computer system 500 may be any portable electronic computer system or electronic device including, for example, a notebook computer, a smartphone, and/or a tablet computer.

As illustrated, the computer system 500 may include, among other things, one or more processors 502, random access memory ("RAM") 504, a communications interface 506, a user interface 508, and a non-transitory computer-readable storage medium 510. The processor 502, RAM 504, communications interface 506, user interface 508, and computer-readable storage medium 510 may be communicatively coupled to each other via a common data bus 512. In some embodiments, the various components of the computer system 500 may be implemented using hardware, software, firmware, and/or any combination thereof.

User interface 508 may include any number of devices allowing a user to interact with the computer system 500. For example, user interface 508 may be used to display an interactive interface to a user. The user interface 508 may be a separate interface system communicatively coupled with the computer system 500 or, alternatively, may be an integrated system such as a display interface for a laptop or other similar device. In certain embodiments, the user interface 508 may be produced on a touch screen display. The user interface 508 may also include any number of other input devices including, for example, keyboard, trackball, and/or pointer devices.

The communications interface 506 may be any interface capable of communicating with other computer systems, peripheral devices, and/or other equipment communicatively coupled to computer system 500. For example, the communications interface 506 may allow the computer system 500 to communicate with other computer systems and/or sensors (e.g., computer systems associated with external databases and/or the Internet and/or sensors configured to measure information associated with a battery system), allowing for the transfer as well as reception of data from such systems and/or sensors. The communications interface 506 may include, among other things, a modem, a satellite data transmission system, an Ethernet card, and/or any other suitable device that enables the computer system 500 to connect to databases and networks, such as LANs, MANs, WANs and the Internet.

Processor 502 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 502 may be configured to execute computer-readable instructions stored on non-transitory computer-readable storage medium 510. Computer-readable storage medium 510 may store other data or information as desired. In some embodiments, the computer-readable instructions may include computer executable functional modules 514. For example, the computer-readable instructions may include one or more functional modules configured to implement all or part of the functionality of the systems and methods described above. Specific functional models that may be stored on computer-readable storage medium 510 may include modules to estimate a predicted power capability of a battery system and/or any other module or modules configured to implement the systems and methods disclosed herein.

The system and methods described herein may be implemented independent of the programming language used to create the computer-readable instructions and/or any operating system operating on the computer system 500. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 500 may be in response to user commands, results of previous processing, or a request made by another processing machine. It will be appreciated that computer system 500 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method of estimating a power capability of a battery system comprising:
    operating, by a battery control system, the battery system at a voltage limit of the battery system;
    measuring, using a current sensor, an initial battery current when the battery system operates at the voltage limit;
    operating, by the battery control system, the battery system at a current limit of the battery system;
    measuring, using a voltage sensor, an initial battery voltage when the battery system operates at the current limit;
    estimating, by the battery control system, a first future battery current at a first future iteration interval time when the battery system operates at the voltage limit based on the initial battery current; and
    estimating, by the battery control system, a first future battery voltage at the first future iteration interval time when the battery system operates at the current limit based on the initial battery voltage;
    determining, by the battery control system, a first estimated voltage-limited power capability of the battery system at the first future iteration interval time based on the first future battery current;
    determining, by the battery control system, a first estimated current-limited power capability of the battery system at the first future iteration interval time based on the first future battery voltage;
    determining, by the battery control system, a second estimated voltage-limited power capability based, at least in part, on the first future battery voltage;
    determining, by the battery control system, a second estimated current-limited power capability of the battery system based, at least in part, on the first future battery current; and
    sending, by the battery control system to a vehicle control system, a control action signal configured to implement a control action in a vehicle associated with the battery system based on the second estimated voltage-limited power capability and the second estimated current-limited power capability of the battery system, wherein the control action comprises at least one of changing a maximum drivetrain acceleration allowed by the vehicle control system, changing a maximum drivetrain speed allowed by the vehicle control system, and changing a maximum drivetrain torque allowed by the vehicle control system; and
    implementing, by the vehicle control system in response to receiving the control action signal, the control action in the vehicle.

2. The method of claim 1, wherein the determining the second estimated voltage-limited power capability further comprises:
    estimating, by the battery control system, a second future battery current at a second future iteration interval time following the first future iteration interval time when the battery system operates at the voltage limit based on the first future battery current, and
    determining, by the battery control system, the second estimated voltage-limited power capability of the battery system at the second future iteration interval time based on the second future battery current; and
    wherein determining the second estimated current-limited power capability further comprises:
    estimating, by the battery control system, a second future battery voltage at the second future iteration interval time following the first future iteration interval time when the battery system operates at the current limit based on the first future battery voltage, and
    determining, by the battery control system, second estimated current-limited power capability of the battery system at the second future iteration interval time based on the second future battery voltage.

3. The method of claim 1, wherein estimating the first future battery current and estimating the first future battery voltage comprises determining parameters associated with a model of the battery system at the first future iteration interval time.

4. The method of claim 3, wherein the model comprises an equivalent circuit model.

5. A non-transitory computer-readable storage medium storing instructions that, when executed by a processor, cause the processor to perform a method for estimating a power capability of a battery system comprising:
    operating the battery system at a voltage limit of the battery system;
    measuring, using a current sensor, an initial battery current when the battery system operates at the voltage limit;

operating the battery system at a current limit of the battery system;

measuring, using a voltage sensor, an initial battery voltage when the battery system operates at the current limit;

estimating a first future battery current at a first future iteration interval time when the battery system operates at the voltage limit based on the initial battery current;

estimating a first future battery voltage at the first future iteration interval time when the battery system operates at the current limit based on the initial battery voltage;

determining a first estimated voltage-limited power capability of the battery system at the first future iteration interval time based on the first future battery current;

determining a first estimated current-limited power capability of the battery system at the first future iteration interval time based on the first future battery voltage; and implementing a control action in a vehicle associated with the battery system based on the first estimated voltage-limited power capability and the second estimated current-limited power capability of the battery system, wherein the control action comprises at least one of changing a maximum drivetrain acceleration allowed by a vehicle control system, changing a maximum drivetrain speed allowed by the vehicle control system, and changing a maximum drivetrain torque allowed by the vehicle control system.

6. The non-transitory computer-readable storage medium of claim 5, wherein the method further comprises sending the first estimated voltage-limited power capability to a control system associated with the battery system.

7. The non-transitory computer-readable storage medium of claim 5, wherein the method further comprises sending the first estimated current-limited power capability to a control system associated with the battery system.

8. The non-transitory computer-readable storage medium of claim 5, wherein the method further comprises:

estimating a second future battery current at a second future iteration interval time following the first future iteration interval time when the battery system operates at the voltage limit based on the first future battery current;

estimating a second future battery voltage at the second future iteration interval time when the battery system operates at the current limit based on the first future battery voltage;

determining a second estimated voltage-limited power capability of the battery system at the second future iteration interval time based on the second future battery current; and determining a second estimated current-limited power capability of the battery system at the second future iteration interval time based on the second future battery voltage.

9. The non-transitory computer-readable storage medium of claim 5, wherein estimating the first future battery current and estimating the first future battery voltage comprises determining parameters associated with a model of the battery system at the first future iteration interval time.

10. The non-transitory computer-readable storage medium of claim 9, wherein the model comprises an equivalent circuit model.

11. A battery control system comprising:

a processor; and a non-transitory computer medium storing instructions configured to cause the battery control system to:

operate the battery system at a voltage limit of the battery system;

measure an initial battery current when the battery system operates at the voltage limit;

operate the battery system at a current limit of the battery system;

measure an initial battery voltage when the battery system operates at the current limit;

estimate a first future battery current at a first future iteration interval time when the battery system operates at the voltage limit based on the initial battery current; and estimate a first future battery voltage at the first future iteration interval time when the battery system operates at the current limit based on the initial battery voltage;

determine a first estimated voltage-limited power capability of the battery system at the first future iteration interval time based on the first future battery current;

determine a first estimated current-limited power capability of the battery system at the first future iteration interval time based on the first future battery voltage;

determine a second estimated voltage-limited power capability based, at least in part, on the first future battery voltage;

determine a second estimated current-limited power capability of the battery system based, at least in part, on the first future battery current; and transmit, to a vehicle control system communicatively coupled to the battery control system, a control action signal configured to implement a control action in a vehicle associated with the battery system based on the second estimated voltage-limited power capability and the second estimated current-limited power capability of the battery system, wherein the control action comprises at least one of changing a maximum drivetrain acceleration allowed by the vehicle control system, changing a maximum drivetrain speed allowed by the vehicle control system, and changing a maximum drivetrain torque allowed by the vehicle control system.

* * * * *